(12) United States Patent
Lee et al.

(10) Patent No.: US 8,987,767 B2
(45) Date of Patent: Mar. 24, 2015

(54) LIGHT EMITTING DEVICE HAVING IMPROVED LIGHT EXTRACTION EFFICIENCY

(71) Applicant: Samsung Electronics Co., Ltd., Suwon-Si, Gyeonggi-Do (KR)

(72) Inventors: Gae-hwang Lee, Seongnam-si (KR); Kyung-wook Park, Chungcheongnam-do (KR); Yoon-young Kwon, Chungcheongnam-do (KR); Jeong-woo Park, Chungcheongnam-do (KR); Mi-jeong Song, Suwon-si (KR); Yong-wan Jin, Seoul (KR)

(73) Assignees: Samsung Electronics Co., Ltd. (KR); Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/098,865

(22) Filed: Dec. 6, 2013

(65) Prior Publication Data
US 2014/0167085 A1    Jun. 19, 2014

(30) Foreign Application Priority Data

Dec. 14, 2012  (KR) .................. 10-2012-0146629

(51) Int. Cl.
| | | |
|---|---|---|
| H01L 33/00 | (2010.01) | |
| H01L 27/32 | (2006.01) | |
| H01L 51/52 | (2006.01) | |

(52) U.S. Cl.
CPC ........ *H01L 27/3295* (2013.01); *H01L 51/5268* (2013.01)
USPC ......................................................... 257/98

(58) Field of Classification Search
CPC .................................................. H01L 51/5262
USPC ............................................................ 257/98
See application file for complete search history.

(56) References Cited

U.S. PATENT DOCUMENTS

| | | | |
|---|---|---|---|
| 8,362,686 B2 * | 1/2013 | Tchakarov et al. ........... | 313/503 |
| 2003/0164679 A1 * | 9/2003 | Hamano et al. ............... | 313/504 |
| 2007/0182297 A1 | 8/2007 | Drazic et al. | |
| 2007/0221907 A1 * | 9/2007 | Jang et al. ........................ | 257/13 |
| 2007/0241671 A1 | 10/2007 | Kai et al. | |
| 2011/0073897 A1 * | 3/2011 | Kang et al. ...................... | 257/98 |

FOREIGN PATENT DOCUMENTS

| | | |
|---|---|---|
| JP | 2002-260844 A | 9/2002 |
| JP | 2007-286111 A | 11/2007 |
| KR | 2000-0046140 A | 7/2000 |

* cited by examiner

*Primary Examiner* — Trung Q Dang
(74) *Attorney, Agent, or Firm* — Harness, Dickey & Pierce, PLC

(57) ABSTRACT

According to example embodiments, a light emitting device includes a transparent substrate, a transparent electrode on a transparent substrate, a transparent light extraction layer at least partially on the transparent electrode, a light emitting layer on the transparent electrode, and a reflective electrode on the light extraction layer and the light emitting layer. The light extraction layer and the light emitting layer may be alternately and repeatedly arranged between the transparent electrode and the reflective electrode.

20 Claims, 6 Drawing Sheets

LIGHT EMITTING DEVICE HAVING IMPROVED LIGHT EXTRACTION EFFICIENCY

CROSS-REFERENCE TO RELATED APPLICATIONS

This application claims priority under 35 U.S.C. §119 to Korean Patent Application No. 10-2012-0146629, filed on Dec. 14, 2012, in the Korean Intellectual Property Office, the disclosure of which is incorporated herein in its entirety by reference.

BACKGROUND

1. Field

Example embodiments relate to a light emitting device having improved light extraction efficiency, and more particularly, to an organic light emitting diode (OLED) including a light extraction layer for improving light extraction efficiency.

2. Description of the Related Art

A light emitting diode (LED) may be a point light source formed of compound semiconductor materials. Compared to LEDs, an OLED may have many advantages such as low power consumption, high outdoor visibility, and flexibility in addition to surface light emission. For this reason, the OLED may receive attention for applications as a lighting device in addition to a display device. However, the OLED may have low light extraction efficiency because only about 20 percent of generated light typically may be emitted to the outside. Such a low light extraction efficiency mainly results from the difference in refractive indices of an organic light emitting layer and external air. That is, among the light generated in the organic light emitting layer, only the light of a specific angular region is emitted to the outside and the light of a remaining angular region is absorbed in the inside of the OLED and disappears due to total reflection at the interface of air.

Light extraction layers having various structures may be used for improving light extraction efficiency of the OLED. For example, a light extraction layer having a micro-lens array shape may be attached on the external surface of a substrate. However, the external light extraction layer attached on the external surface of the substrate may not reduce (and/or prevent) optical losses occurring between internal layers of the OLED.

An inner light extraction layer may be disposed between a substrate and a transparent electrode. The internal light extraction layer may include uneven surfaces or scatters to change a light path to the outside; consequently, the surface flatness of the transparent electrode may be deteriorated. Once the surface flatness of the transparent electrode is deteriorated, charges such as holes and electrons may concentrate in a specific region and the electrical characteristics of the OLED may deteriorate. Therefore, in order to reduce (and/or prevent) the deterioration of the electrical characteristics of the OLED, a planarization layer may be further added between a light extraction layer and a transparent electrode.

SUMMARY

Example embodiments relate to a light emitting device having improved light extraction efficiency.

Additional aspects will be set forth in part in the description which follows and, in part, will be apparent from the description, or may be learned by practice of example embodiments.

According to example embodiments, a light emitting device includes: a transparent substrate; a transparent electrode on the transparent substrate; a transparent light extraction layer at least partially on the transparent electrode; a light emitting layer on the transparent electrode; and a reflective electrode on the light extraction layer and the light emitting layer. The light emitting layer and the light extraction layer are alternately and repeatedly arranged between the transparent electrode and the reflective electrode In example embodiments, a refractive index of the light extraction layer may be higher than a refractive index of the light emitting layer.

In example embodiments, the light extraction layer may have a lattice structure including a plurality of unit cells.

In example embodiments, the light emitting layer may be in at least one of the plurality of unit cells of the light extraction layer.

In example embodiments, a side surface of the light extraction layer may be an inclined surface, and the light emitting layer may contact the inclined surface of the light extraction layer.

In example embodiments, the light extraction layer may include a transparent medium and a plurality of scatters distributed in the transparent medium.

In example embodiments, the plurality of scatters may include at least one of transparent particles having a different refractive index than the transparent medium, and reflective particles having a light reflecting surface.

In example embodiments, the light extraction layer may include a transparent medium and a plurality of transparent scattering patterns. A refractive index of the transparent scattering patterns may be different than a refractive index of the transparent medium. The plurality of scattering patterns may be formed on at least one of an interface of the transparent electrode and the transparent medium, and an interface of the reflective electrode and the transparent medium.

In example embodiments, an interface between the light extraction layer and the reflective electrode may have an uneven form.

In example embodiments, an upper surface of the light extraction layer may define grooves at center portions of the light extraction layer between adjacent parts of the light emitting layer, and a height of the upper surface of the light extraction layer in at least one of the center portions may be lower than an upper surface of the light emitting layer.

In example embodiments, an upper surface of the light extraction layer may define protruding portions at center portions of the light extraction layer between adjacent parts of the light emitting layer, and a height of the upper surface of the light extraction layer in at least one of the protruding portions of the light extraction layer may be higher than a height of an upper surface of the light emitting layer.

According to example embodiments, a light emitting device includes: a transparent substrate; a transparent electrode on the transparent substrate; a transparent light extraction layer at least partially on the transparent electrode, the light extraction layer forming interfaces with the transparent electrode; a light emitting layer on the transparent electrode and the light extraction layer, the light emitting layer forming interfaces with the transparent electrode that alternate with the interfaces between the transparent electrode and the light extraction layer; and a reflective electrode on the light emitting layer.

In example embodiments, a refractive index of the light extraction layer may be higher than a refractive index of the light emitting layer.

In example embodiments, the light extraction layer may have a lattice structure including a plurality of unit cells.

In example embodiments, a side surface of the light extraction layer may be an inclined surface, the light emitting layer may contact the inclined surface of the light extraction layer.

In example embodiments, the light extraction layer may include a transparent medium and a plurality of scatters distributed in the transparent medium.

In example embodiments, the light extraction layer may include a transparent medium and a plurality of transparent scattering patterns. A refractive index of the plurality of transparent scattering patterns may be different than a refractive index of the transparent medium. The plurality of scattering patterns may be on an interface of the transparent electrode and the transparent medium.

According to example embodiments, a light emitting device includes: a transparent substrate; a transparent light extraction layer on the transparent substrate, the light extraction layer forming interfaces with the transparent substrate; a plurality of transparent electrodes on the transparent substrate, the plurality of transparent electrodes forming interfaces with the transparent substrate that alternate with the interfaces between the light extraction layer and the transparent substrate; a light emitting layer on the plurality of transparent electrodes, the light emitting layer including side surfaces that are adjacent to corresponding side surfaces of the light extraction layer; and a reflective electrode on the light extraction layer and the light emitting layer.

In example embodiments, the light extraction layer may have a lattice structure including a plurality of unit cells.

In example embodiments, the plurality of transparent electrodes and the light emitting layer may be the unit cells of the light extraction layer.

In example embodiments, a side surface of the light extraction layer may be an inclined surface, and the light emitting layer may contact the inclined surface of the light extraction layer.

In example embodiments, the light extraction layer may include a transparent medium and a plurality of scatters distributed in the transparent medium.

In example embodiments, the plurality of scatters may include at least one of transparent particles having a different refractive index than the transparent medium and reflective particles having a light reflecting surface.

In example embodiments, the light extraction layer may include a transparent medium and a plurality of transparent scattering patterns in the transparent medium, and a refractive index of the plurality of transparent scattering patterns may be different than a refractive index of the transparent medium. The plurality of scattering patterns may be on at least one of: an interface of the transparent medium and the transparent substrate, and an interface of the transparent medium and the reflective electrode.

In example embodiments, an interface between the light extraction layer and the reflective electrode may have an uneven form.

In example embodiments, an upper surface of the light extraction layer may define grooves at center portions of the light extraction layer between adjacent parts of the light emitting layer, a height of the upper surface of the light extraction layer in at least one of the center portions may be lower than a height of the upper surface of the light emitting layer.

In example embodiments, an upper surface of the light extraction layer may define protruding portions at center portions of the light extraction layer between adjacent parts of the light emitting layer, and a height of the upper surface of the light extraction layer in at least one of the protruding portions may be higher than a height of an upper surface of the light emitting layer.

According to example embodiments, a light emitting device includes: a transparent substrate; a transparent light extraction layer on the transparent substrate, the light extraction layer forming interfaces with the transparent substrate; a plurality of transparent electrodes on the transparent substrate, the plurality of transparent electrodes forming interfaces with the transparent substrate that alternate with the interfaces between the light extraction layer and the transparent substrate; a light emitting layer on the plurality of transparent electrodes and the light extraction layer; and a reflective electrode on the light emitting layer. The light emitting layer may be adjacent to at least one side surface of the light extraction layer.

In example embodiments, the light extraction layer may have a lattice structure including a plurality of unit cells.

In example embodiments, the plurality of transparent electrodes may be in the plurality of unit cells of the light extraction layer.

In example embodiments, the at least one side surface of the light extraction layer may be inclined and contact the light emitting layer.

In example embodiments, the light extraction layer may include a transparent medium and a plurality of scatters distributed in the transparent medium.

In example embodiments, the light extraction layer may include a transparent medium and a plurality of transparent scattering patterns in the transparent medium. A refractive index of the plurality of transparent scattering patterns may be different than a refractive index of the transparent medium. The plurality of scattering patterns may be formed on an interface of the transparent medium and the transparent substrate.

According to example embodiments, a light emitting device includes: a transparent substrate; at least one transparent electrode on the transparent substrate; a light extraction layer on at least one of the transparent substrate and the at least one transparent electrode, the light extraction layer exposing portions of one of the transparent substrate and the at least one transparent electrode; a light emitting layer on the portions of the one of the transparent substrate and the at least one transparent electrode exposed by the light extraction layer; and a reflective electrode on the light emitting layer and an entire surface of the light extraction layer that is opposite the transparent substrate.

In example embodiments, the light emitting layer may extend contiguously between the reflective electrode and the light extraction layer and over the portions of the one of the transparent substrate and the at least one transparent electrode exposed by the light extraction layer.

In example embodiments, the light extraction layer may be on the transparent substrate, the light extraction layer may form interfaces with the transparent substrate, the at least one transparent electrode may be a plurality of transparent electrodes on the substrate, the plurality of transparent electrodes may form interfaces with the transparent substrate that alternate with the interfaces between the light extraction layer and the transparent substrate, the portions exposed by the light extraction layer may be portions of the plurality of transparent electrodes exposed by the light extraction layer, and the light emitting layer may be on the portions of the plurality of transparent electrodes exposed by the light extraction layer.

In example embodiments, the at least one transparent electrode may be one transparent electrode on the transparent substrate, the light extraction layer may be on the transparent electrode and form interfaces with the transparent electrode, the portions exposed by the light extraction layer may be portions of the transparent electrode exposed by the light extraction layer, the light emitting layer may be on the portions of the transparent electrode exposed by the light extraction layer, and the light emitting layer may form interfaces with the transparent electrode that alternate with the interfaces between the light extraction layer and the transparent substrate.

In example embodiments, the light extraction layer may include a transparent medium, and the light extraction layer may further include one of a plurality of scatters and a plurality of transparent scattering patterns distributed in the transparent medium.

BRIEF DESCRIPTION OF THE DRAWINGS

These and/or other aspects will become apparent and more readily appreciated from the following description of non-limiting embodiments, as illustrated in the accompanying drawings. The drawings are not necessarily to scale, emphasis instead being placed upon illustrating the principles of example embodiments. In the drawings.

DETAILED DESCRIPTION

Figure 1A:
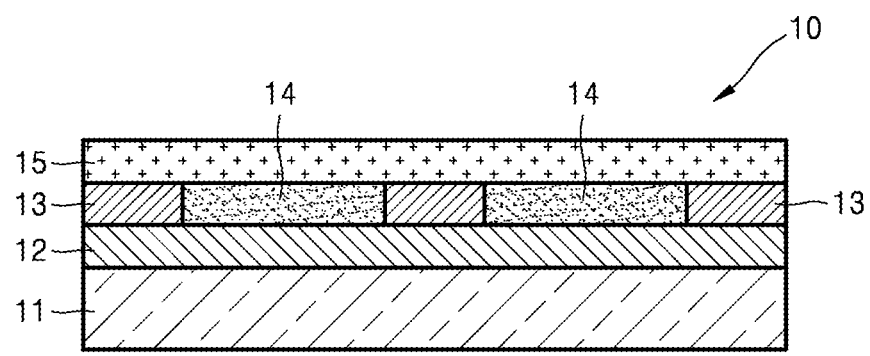
FIG. 1A is a cross-sectional view illustrating a light emitting device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a cross-sectional view illustrating a light emitting device according to example embodiments. Referring to FIG. 1A, the light emitting device 10 may include a transparent substrate 11, a transparent electrode 12 on the transparent substrate 11, a transparent light extraction layer 13 on part of the transparent electrode 12, a light emitting layer 14 on the transparent electrode 12, and a reflective electrode 15 disposed to cover the light extraction layer 13 and the light emitting layer 14.

The transparent substrate 11 may be formed of transparent glass or plastic materials. For example, the transparent electrode 12 may be formed of a transparent conductive oxide such as an Indium Tin Oxide (ITO) or an Indium Zinc Oxide (IZO), but example embodiments are not limited thereto. Additionally, besides the transparent conductive oxide, a graphene or a metal having a very thin thickness for light transmission may be used as the transparent electrode 12. The metal having a very thin thickness may have a thickness of less than 100 nm, and/or less than 50 nm, but example embodiments are not limited thereto. The light extraction layer 13 serves to emit a light from the light emitting layer 14 to the outside through the transparent substrate 11. For this, the light extraction layer 13 may be formed of a material having a similar refractive index to the transparent substrate 11 or a material having a greater refractive index than the light emitting layer 13. The optimal refractive index of the light extraction layer 13 may vary according to a light extraction method of the light extraction layer 13. Additionally, in order to improve light extraction efficiency, the light extraction layer 13 may be formed of a material with less optical absorption. For example, a transparent oxide such as $SiO_2$ or $TiO_2$ or an organic matter such as a photoresist may be used as a material of the light extraction layer 13. Additionally, the reflective electrode 15 may be formed of a conductive metallic material having excellent reflectivity such as Au, Ag, or Al.

The light emitting layer 14 may be formed of an organic light emitting material. However, example embodiments are not limited thereto. That is, besides an organic light emitting material, as a material of the light emitting layer 14, an inorganic light emitting material such as quantum dots or another light emitting material may be used. Although details are not shown in the drawings, when the transparent electrode 12 is an anode and the reflective electrode 15 is a cathode, a hole injection layer and a hole transfer layer may be further interposed between the transparent electrode 12 and the light emitting layer 14, and an electron injection layer and an electron transfer layer may be further interposed between the reflective electrode 15 and the light emitting layer 14. Additionally, when the transparent electrode 12 is a cathode and the reflective electrode 15 is an anode, an electron injection layer and an electron transfer layer may be further interposed between the transparent electrode 12 and the light emitting layer 14, and a hole injection layer and a hole transfer layer may be further interposed between the reflective electrode 15 and the light emitting layer 14.

Figure 1B:
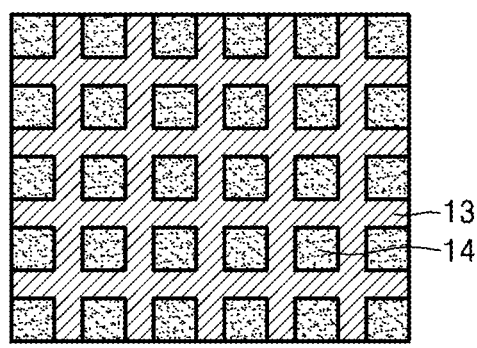
FIG. 1B is a view illustrating a light extraction layer of a light emitting device of FIG. 1A.

As shown in the cross-sectional view of FIG. 1A, the light extraction layer 13 and the light emitting layer 14 may be together formed on the upper surface of the transparent electrode 12, and may be alternately and repeatedly formed on the upper surface of the transparent electrode 12. Additionally, as shown in the plan view of FIG. 1A in FIG. 1B, the light extraction layer 13 may be distributed with a regular or irregular lattice structure having a plurality of unit cells, along the entire surface of the transparent electrode 12. Although a lattice structure where a unit cell has a square form is shown in FIG. 1B, the light extraction layer 13 may be formed with a lattice structure where a unit cell has another polygonal form (such as a triangular or hexagonal form) or a circular form. Furthermore, the light emitting layer 14 may be disposed in the unit cells of the light extraction layer 13. In such a structure, the light vertically progressing toward the transparent substrate among the light from the light emitting layer 14 passes through the transparent electrode 12 and the transparent substrate 11 to be emitted to the outside without total reflection. Moreover, the light progressing obliquely among the light from the light emitting layer 14 changes its progressing path by the light extraction layer 13 and then, passes through the transparent electrode 12 and the transparent substrate 11 to be emitted to the outside.

Although the light extraction layer 13 having a simple vertical pillar form is shown in the cross-sectional view of FIG. 1A for convenience, in order to emit the light from the light emitting layer 14 to the transparent electrode 12, the light extraction layer 13 may have a more complex form. FIGS. 2A to 2E are cross-sectional views illustrating examples of various structures of the light extraction layer 13 to improve light extraction efficiency.

Figure 2A:
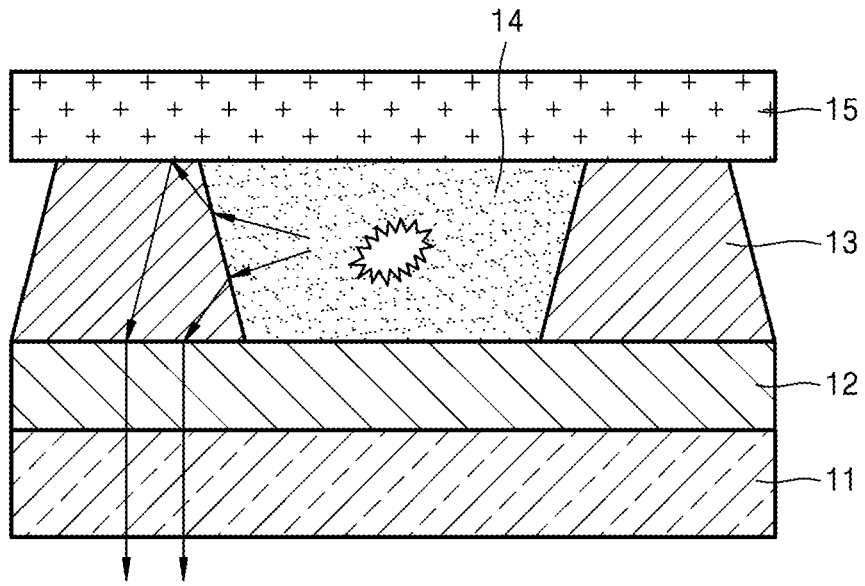
FIGS. 2A to 2E are cross-sectional views illustrating various structures of a light extraction layer.

First, as shown in FIG. 2A, the light extraction layer 13 may be formed in order to allow a side surface that the light emitting layer 14 contacts to be inclined. For example, the light extraction layer 13 may be formed with a trapezoidal shape. Although a wide lower surface and a narrow upper surface are shown in FIG. 2A, the light extraction layer 13 having a narrow lower surface and a wide upper surface may be formed. An inclined angle of the light extraction layer 13 may vary depending on a relationship between a refractive index of the transparent substrate 11, a refractive index of the transparent electrode 12, a refractive index of the light extraction layer 13, and a refractive index of the light emitting layer 14. The inclined angle is enough if the light incident from the light emitting layer 14 is refracted by the surface of the light extraction layer 13 and then its path is changed toward the reflective electrode 15 or the transparent electrode 12.

Figure 2B:
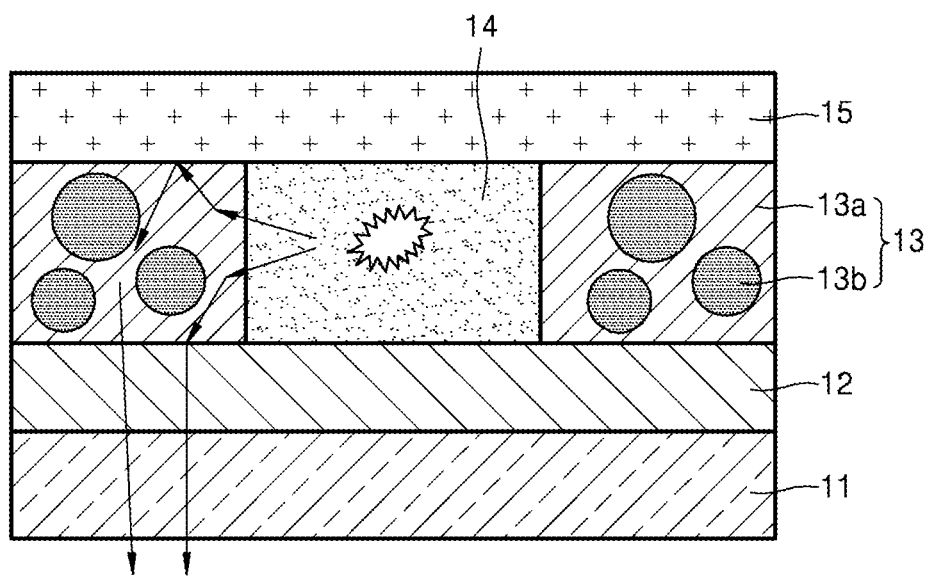

Additionally, referring to FIG. 2B, the light extraction layer 13 may include a plurality of scatters 13b distributed in a transparent medium 13a. The transparent medium 13a may have a simple vertical pillar form but also may be inclined as shown in FIG. 2A. Furthermore, the size of each of the plurality of scatters 13b may be uniform but may vary if necessary. Each scatter 13b may be formed of transparent particles having a different refractive index than the transparent medium 13a. For example, the scatter 13b may include pores. Instead of this, the scatter 13b may include reflective nano particles having light reflecting surfaces. Furthermore, the scatter 13b may include a combination of transparent materials and reflective particles.

Figure 2C:
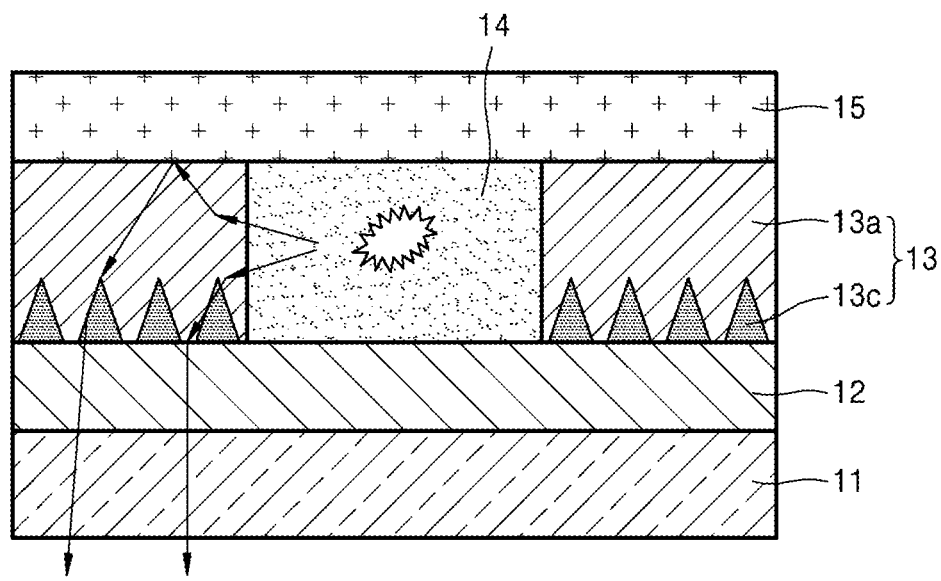

Additionally, referring to FIG. 2C, the light extraction layer 13 may include a transparent medium 13a and a plurality of scattering patterns 13c on the interface of the transparent medium 13a and the transparent electrode 12. The plurality of scattering patterns 13c may be formed of a transparent material having a different refractive index than the transparent medium 13a. For example, the scattering pattern 13c may have a higher refractive index than the transparent medium 13a. The scattering pattern 13c may be an uneven micro pattern that is periodically repeated. For example, the scattering pattern 13c may be a micro prism array. Instead of that, the scattering pattern 13c may be an irregular micro pattern.

Figure 2D:
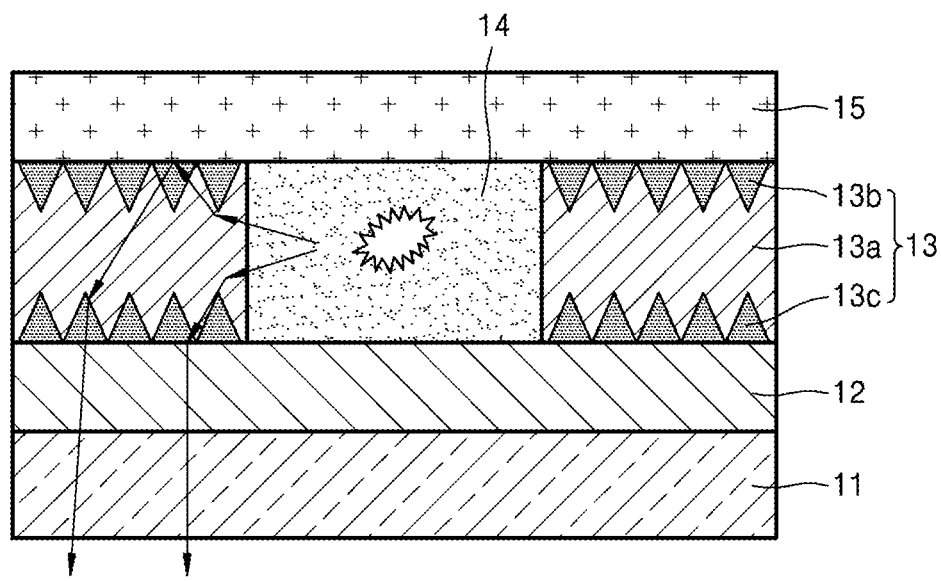

Although the scatter pattern 13c only on the transparent electrode 12 is shown in FIG. 2C, as shown in FIG. 2D, a plurality of scattering patterns 13d may be further formed on the interface of the transparent medium 13a and the reflective electrode 15. Additionally, the scattering pattern 13c may not be formed on the transparent electrode 12 and may be formed only on the reflective electrode 15.

Figure 2E:
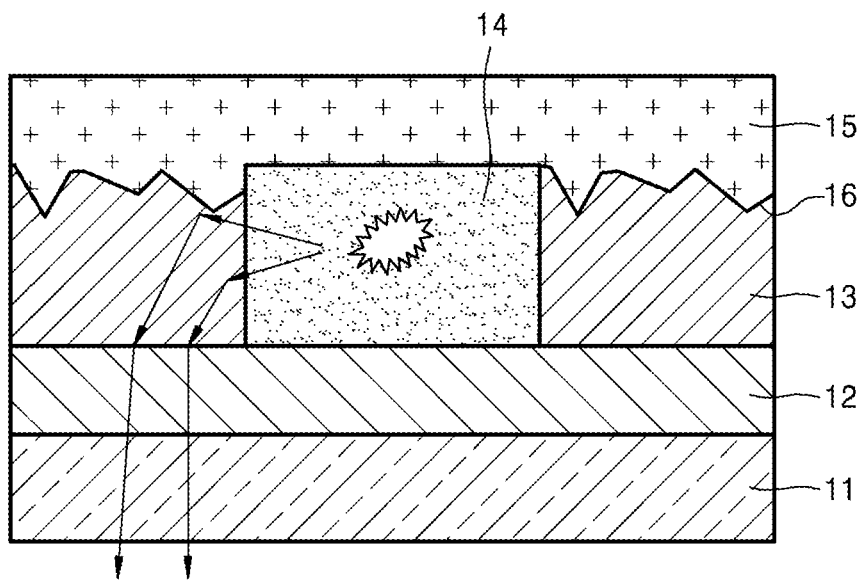

As shown in FIG. 2E, the interface 16 of the light extraction layer 13 and the reflective electrode 15 may be formed with an uneven form. The interface 16 may have a periodic micro pattern or an irregular uneven pattern.

The shapes of the light extraction layer 13 described with reference to FIGS. 2A to 2E are just examples, and thus, other shapes of the light extraction layer 13 are possible. Additionally, the light extraction layer 13 may be implemented with one or a combination of the above mentioned forms of FIGS. 2A to 2E. For example, a side surface that the light emitting layer 14 contacts is an inclined surface; the scattering pattern 13c is formed on the transparent electrode 12; and the interface 16 of the light extraction layer 13 and the reflective electrode 15 may have an uneven form.

Figure 3:
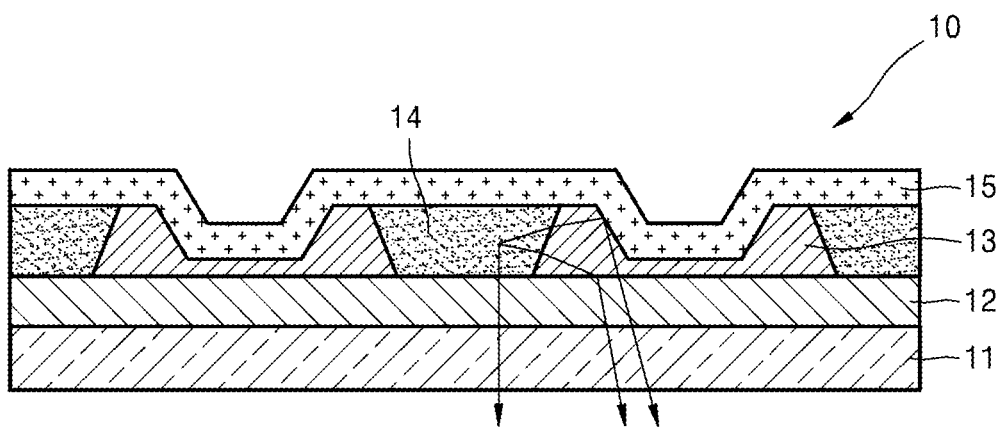
FIG. 3 is a cross-sectional view illustrating a light emitting device according to example embodiments.
Figure 4:
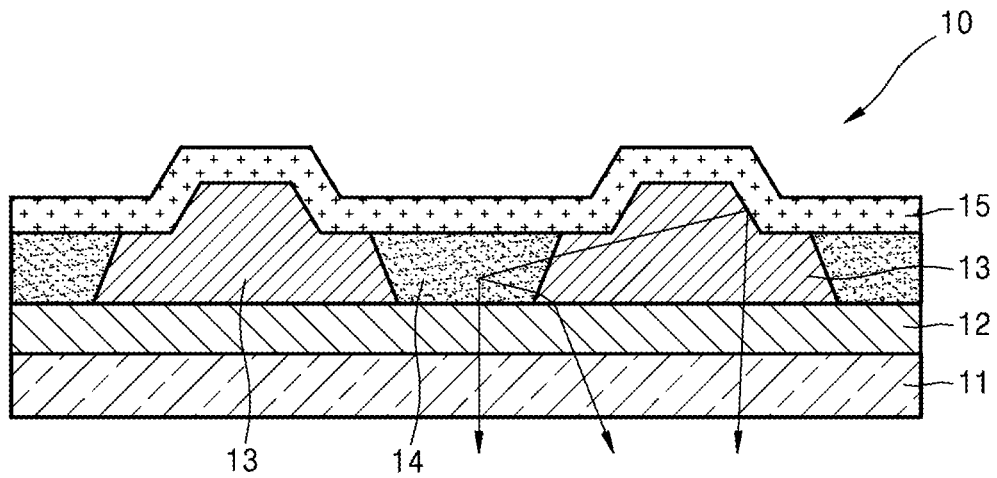
FIG. 4 is a cross-sectional view illustrating a light emitting device according to example embodiments.

Additionally, a groove or protruding portion may be formed at the center portion of the upper surface of the light extraction layer 13, so that unevenness may be formed on the reflective surface of the reflective electrode 15. For example, referring to FIG. 3, since a groove is formed at the center portion of the upper surface of the light extraction layer 13, the height at the center portion of the light extraction layer 13 may be lower than that at the upper surface of the light emitting layer 13. Accordingly, the height of a reflective surface of the reflective electrode 15 in a region contacting the center portion of the light extraction layer 13 may be lower than that in a region contacting the light emitting layer 14. Additionally, referring to FIG. 4, since a protruding portion is formed at the center portion of the upper surface of the light extraction layer 13, the height at the center portion of the upper surface of the light extraction layer 13 may be higher than that at the upper surface of the light emitting layer 14. Accordingly, the height of a reflective surface of the reflective electrode 15 in a region contacting the center portion of the light extraction layer 13 may be higher than that in a region contacting the light emitting layer 14. Light extraction efficiency of the light emitting device 10 may be further improved by using the above forms of the light extraction layer 13. Although it is described in FIGS. 3 and 4 that a side surface of the light extraction layer 13 is an inclined surface, examples shown in FIGS. 2B to 2E may be respectively applicable to the light emitting devices according to example embodiments in FIGS. 3 and 4.

According to example embodiments, since the light extraction layer 13 is not between the transparent substrate 11 and the transparent electrode 12 and the light extraction layer 13 is disposed on the transparent electrode 12, the light extraction layer 13 may not affect the flatness of the transparent electrode 12. Accordingly, there is no need to use an additional planarization layer to increase the flatness of the transparent electrode 12. Accordingly, the manufacturability of the light emitting device 10 may be improved and also, its manufacturing time and cost may be reduced. Additionally, since the light extraction layer 13 may be disposed adjacent to the light emitting layer 14, light extraction efficiency of the light emitting device 10 may be further improved.

Figure 5:
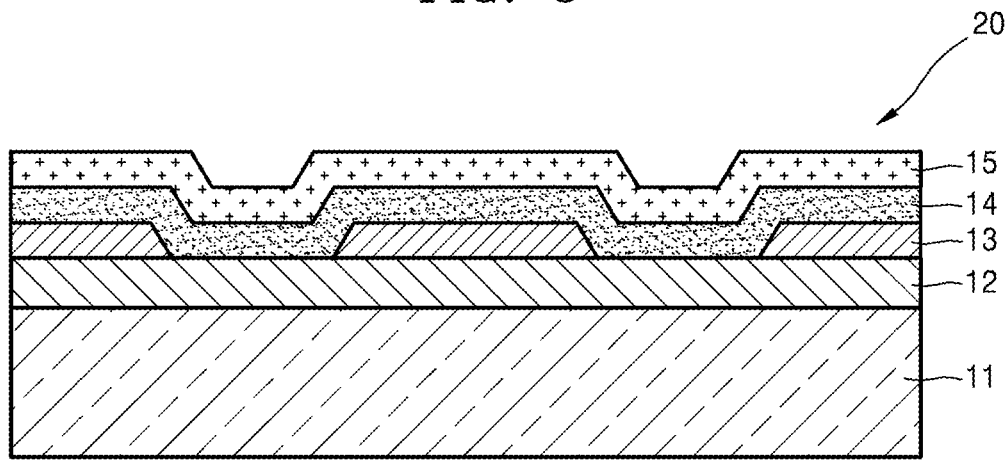
FIG. 5 is a cross-sectional view illustrating a light emitting device according to example embodiments.

Moreover, FIG. 5 is a cross-sectional view illustrating a light emitting device 20 according to example embodiments. Referring to FIG. 5, the light emitting layer 14 may be formed to cover the light extraction layer 13. Referring to FIGS. 1 to 4, the light emitting layer 14 is disposed in a unit cell of the light extraction layer 13, and the reflective electrode 15 is disposed adjacent to both the light extraction layer 13 and the light emitting layer 14. In this case, a process for forming the light emitting layer 14 may become complex. Accordingly, as shown in FIG. 5, after the light extraction layer 13 is formed on the transparent electrode 12, the light emitting layer 14 may be formed to cover the transparent electrode 12 and the light extraction layer 13 and the reflective electrode 15 may be formed thereon.

Figure 6:
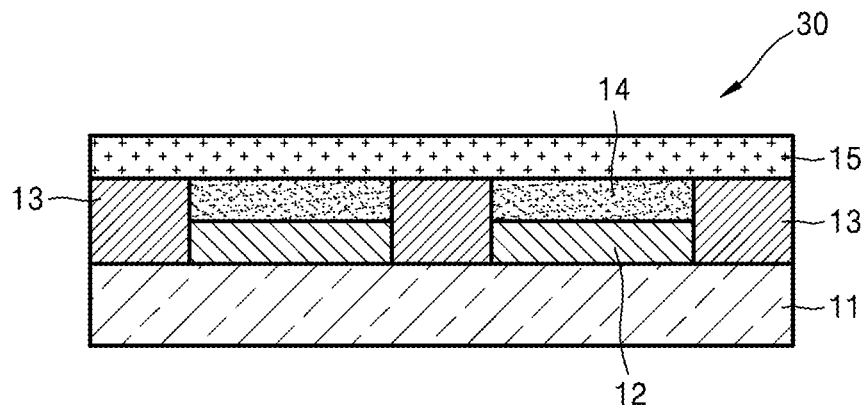
FIG. 6 is a cross-sectional view illustrating a light emitting device according to example embodiments.

Until now, although it is described that the light extraction layer 13 is disposed on the transparent electrode 12, the light extraction layer 13 may be directly disposed on the transparent substrate 11. For example, FIG. 6 is a cross-sectional view illustrating the light emitting device 30 according to example embodiments. Referring to FIG. 6, the light emitting device 30 may include a transparent substrate 11, a transparent light extraction layer 13 on part of the transparent substrate 11, a transparent electrode 12 on the transparent substrate 11, a light emitting layer 14 on the transparent electrode 12, and a reflective electrode 15 disposed to cover the light extraction layer 13 and the light emitting layer 14.

As shown in FIG. 6, the transparent electrode 12 and the light extraction layer 13 may be together formed on the upper surface of the transparent substrate 11, and may be alternately and repeatedly formed on the upper surface of the transparent substrate 11. Also, a side surface of the light extraction layer 13 may be adjacent to the light emitting layer 14 on the transparent electrode 12. As described above, the light extraction layer 13 may have a lattice form including a plurality of unit cells, along the upper surface of the transparent substrate 11, and the transparent electrode 12 and the light emitting layer 14 may be disposed in a unit cell of the light extraction layer 13. In such a structure, since the light extraction layer 13 directly contacts the transparent substrate 11, the light from the light emitting layer 114 may be directly delivered to the transparent substrate 11. Accordingly, light extraction efficiency of the light emitting device 30 may be further improved.

Figure 7:
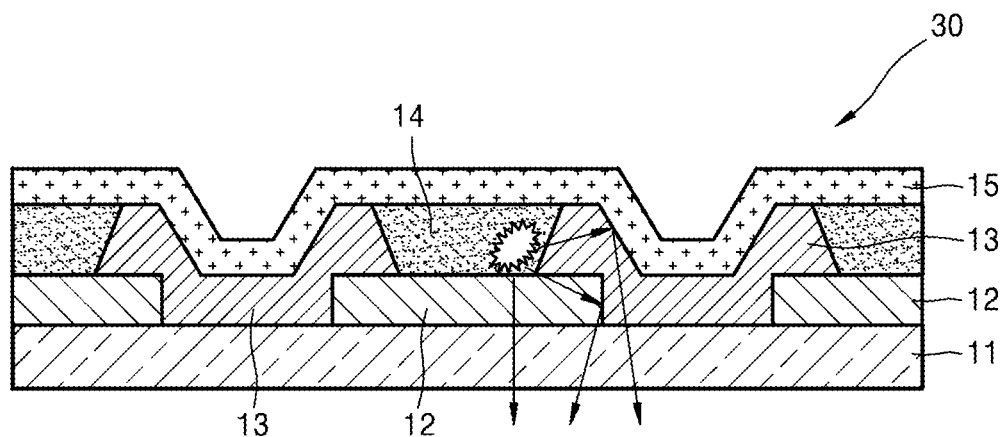
FIG. 7 is a cross-sectional view illustrating a light emitting device according to example embodiments.
Figure 8:
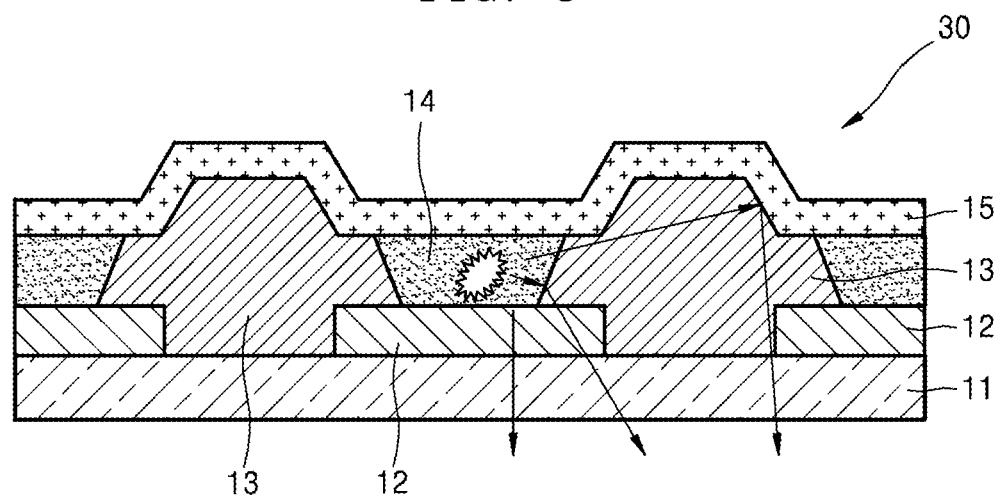
FIG. 8 is a cross-sectional view illustrating a light emitting device according to example embodiments.

The structure of the light extraction layer 13 shown in FIG. 6 may be implemented with the forms of FIGS. 2A to 2E. However, as shown in FIGS. 2C, 2D and 2G to 2J, the plurality of scattering patterns 13c may be formed on the transparent substrate 11 instead of the transparent electrode 12. Additionally, the structures of FIGS. 3 and 4 may be applicable to the light extraction layer 13 shown in FIG. 6. For example, referring to FIG. 7, a groove may be formed at the center portion of the light extraction layer 13, so that the height at the center portion of the light extraction layer 13 may be lower than the surface height of the light emitting layer 14. Accordingly, the height of a reflective surface of the reflective electrode 15 in a region contacting the center portion of the light extraction layer 13 may be lower than that in a region contacting the light emitting layer 14. For example, the groove surface at the center portion of the light extraction layer 13 may be formed at the same height as the upper surface of the transparent electrode 12. Additionally, referring to FIG. 8, a protruding part may be formed at the center portion of the light extraction layer 13, so that the height at the center portion of the light extraction layer 13 may be higher than the surface height of the light emitting layer 14. Accordingly, the height of a reflective surface of the reflective electrode 15 in a region contacting the center portion of the light extraction layer 13 may be higher than that in a region contacting the light emitting layer 14.

Figure 9:
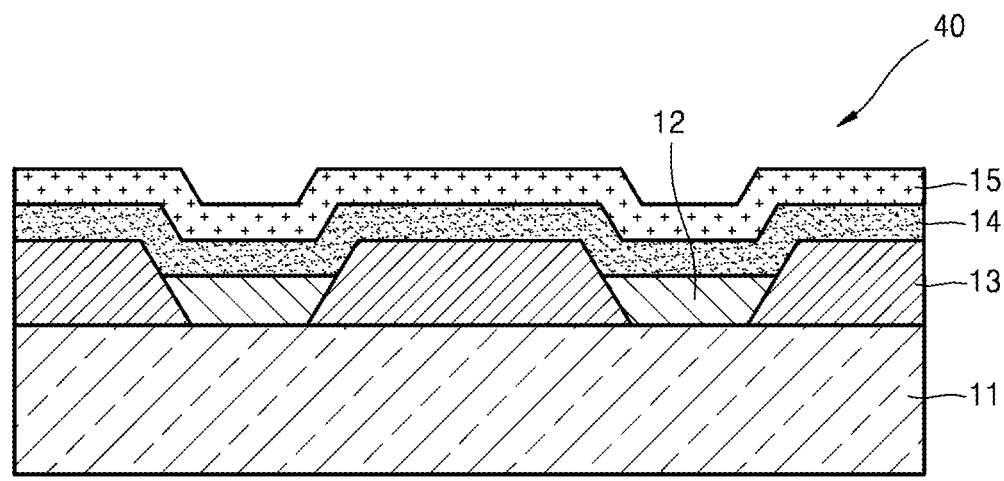
FIG. 9 is a cross-sectional view illustrating a light emitting device according to example embodiments.

Moreover, like the light emitting device according to example embodiments shown in FIG. 5, the light emitting layer 14 may be formed to cover the light extraction layer 13. For example, referring to FIG. 9, a light emitting device 40 according to example embodiments may include a transparent substrate 11, a transparent light extraction layer 13 on part of the transparent substrate 11, a transparent electrode 12 on the transparent substrate 11, a light emitting layer 14 disposed to cover the transparent electrode 12, and the light extraction layer 13, and a reflective electrode 15 disposed to cover the light emitting layer 14. As shown in FIG. 9, the transparent electrode 12 may be disposed in a unit cell of the light extraction layer 13 and the light emitting layer 14 may be formed to cover all of the transparent electrode 12 and the light extraction layer 13. Here, the height of a side surface of the light emitting layer 13 adjacent to the transparent electrode 12 may be higher than that of the upper surface of the transparent electrode 12, so that the light emitting layer 14 may contact part of a side surface of the light emitting layer 13.

It should be understood that example embodiments described herein should be considered in a descriptive sense only and not for purposes of limitation. Descriptions of features or aspects within each light emitting device according to example embodiments should typically be considered as available for other similar features or aspects in other light emitting diodes according to example embodiments.

While some example embodiments have been particularly shown and described, it will be understood by one of ordinary skill in the art that variations in form and detail may be made therein without departing from the spirit and scope of the claims.

What is claimed is:

1. A light emitting device, comprising:
   a transparent substrate;
   at least one transparent electrode on the transparent substrate;
   a light extraction layer on at least one of the transparent substrate and the at least one transparent electrode,
   the light extraction layer exposing portions of one of the transparent substrate and the at least one transparent electrode;
   a light emitting layer on the portions of the one of the transparent substrate and the at least one transparent electrode exposed by the light extraction layer; and
   a reflective electrode on the light emitting layer and an entire surface of the light extraction layer that is opposite the transparent substrate.

2. The light emitting device of claim 1, wherein
   the at least one transparent electrode is one transparent electrode on the transparent substrate,
   the light extraction layer is on the transparent electrode and forms interfaces with the transparent electrode,
   the portions exposed by the light extraction layer are portions of the transparent electrode exposed by the light extraction layer,
   the light emitting layer is on the portions of the transparent electrode exposed by the light extraction layer, and
   the light emitting layer forms interfaces with the transparent electrode that alternate with the interfaces between the light extraction layer and the transparent substrate.

3. The light emitting device of claim 2, wherein a refractive index of the light extraction layer is higher than a refractive index of the light emitting layer.

4. The light emitting device of claim 2, wherein the light extraction layer has a lattice structure including a plurality of unit cells and the light emitting layer is in at least one of the plurality of unit cells of the light extraction layer.

5. The light emitting device of claim 2, wherein
   a side surface of the light extraction layer is an inclined surface,
   and the light emitting layer contacts the inclined surface of the light extraction layer.

6. The light emitting device of claim 2, wherein the light extraction layer comprises:
   a transparent medium; and
   a plurality of scatters distributed in the transparent medium, the plurality of scatters comprising at least one of:
   transparent particles having a different refractive index than the transparent medium; and
   reflective particles having a light reflecting surface.

7. The light emitting device of claim 2, wherein
   the light extraction layer comprises a transparent medium and a plurality of transparent scattering patterns,
   a refractive index of the transparent scattering patterns is different than a refractive index of the transparent medium, and
   the plurality of scattering patterns are on at least one of
      an interface of the transparent electrode and the transparent medium, and
      an interface of the reflective electrode and the transparent medium.

8. The light emitting device of claim 2, wherein an interface between the light extraction layer and the reflective electrode has an uneven form.

9. The light emitting device of claim 2, wherein
   an upper surface of the light extraction layer defines grooves at center portions of the light extraction layer between adjacent parts of the light emitting layer, and
   a height of the upper surface of the light extraction layer in at least one of the center portions is lower than an upper surface of the light emitting layer.

10. The light emitting device of claim 2, wherein
    an upper surface of the light extraction layer defines protruding portions at center portions of the light extraction layer between adjacent parts of the light emitting layer, and
    a height of the upper surface of the light extraction layer in at least one of the protruding portions of the light extraction layer is higher than a height of an upper surface of the light emitting layer.

11. The light emitting device of claim 1, wherein
    the at least one transparent electrode is one transparent electrode on the transparent substrate,
    the light extraction layer is on the transparent electrode and forms interfaces with the transparent electrode,
    the light emitting layer extends contiguously between the reflective electrode and the light extraction layer and over the portions of the at least one transparent electrode exposed by the light extraction layer.

12. The light emitting device of claim 1, wherein
    the light extraction layer is on the transparent substrate,
    the light extraction layer forms interfaces with the transparent substrate,
    the at least one transparent electrode is a plurality of transparent electrodes on the substrate,
    the plurality of transparent electrodes form interfaces with the transparent substrate that alternate with the interfaces between the light extraction layer and the transparent substrate,
    the light emitting layer extends contiguously between the reflective electrode and the light extraction layer and over the portions of the at least one transparent electrode exposed by the light extraction layer.

13. The light emitting device of claim 1, wherein
    the light extraction layer is on the transparent substrate,
    the light extraction layer forms interfaces with the transparent substrate,
    the at least one transparent electrode is a plurality of transparent electrodes on the substrate, the plurality of transparent electrodes form interfaces with the transparent substrate that alternate with the interfaces between the light extraction layer and the transparent substrate, the portions exposed by the light extraction layer are portions of the plurality of transparent electrodes exposed by the light extraction layer; and the light emitting layer is on the portions of the plurality of transparent electrodes exposed by the light extraction layer.

14. The light emitting device of claim 13, wherein the light extraction layer has a lattice structure including a plurality of unit cells and the light emitting layer and the plurality of transparent electrodes are in the unit cells of the light extraction layer.

15. The light emitting device of claim 13, wherein
a side surface of the light extraction layer is an inclined surface, and
the light emitting layer contacts the inclined surface of the light extraction layer.

16. The light emitting device of claim 13, wherein the light extraction layer comprises:
a transparent medium; and
a plurality of scatters distributed in the transparent medium, the plurality of scatters comprising at least one of: transparent particles having a different refractive index than the transparent medium; and
reflective particles having a light reflecting surface.

17. The light emitting device of claim 13, wherein
the light extraction layer comprises a plurality of transparent scattering patterns in a transparent medium,
a refractive index of the plurality of transparent scattering patterns is different than a refractive index of the transparent medium, and
the plurality of scattering patterns are on at least one of
an interface of the transparent medium, and
the transparent substrate and an interface of the transparent medium and the reflective electrode.

18. The light emitting device of claim 13, wherein an interface between the light extraction layer and the reflective electrode has an uneven form.

19. The light emitting device of claim 13, wherein
an upper surface of the light extraction layer defines grooves at center portions of the light extraction layer between adjacent parts of the light emitting layer, and
a height of the upper surface of the light extraction layer in at least one of the center portions is lower than a height of the upper surface of the light emitting layer.

20. The light emitting device of claim 13, wherein
an upper surface of the light extraction layer defines protruding portions at center portions of the light extraction layer between adjacent parts of the light emitting layer, and
a height of the upper surface of the light extraction layer in at least one of the protruding portions is higher than a height of an upper surface of the light emitting layer.

* * * * *